United States Patent
Heyne et al.

(12) 
(10) Patent No.: US 6,259,652 B1
(45) Date of Patent: Jul. 10, 2001

(54) SYNCHRONOUS INTEGRATED MEMORY

(75) Inventors: Patrick Heyne; Thomas Hein; Torsten Partsch; Thilo Marx, all of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/624,448

(22) Filed: Jul. 24, 2000

(30) Foreign Application Priority Data

Jul. 22, 1999 (DE) .............................................. 199 34 500

(51) Int. Cl.[7] ...................................................... G11C 7/00
(52) U.S. Cl. .................... 365/700; 365/189.05; 365/221; 365/233
(58) Field of Search .................................... 365/220, 221, 365/233, 189.05, 189.04

(56) References Cited

U.S. PATENT DOCUMENTS 5,416,745 * 5/1995 Kawashima ........................... 365/220
5,625,594 * 4/1997 Choi et al. ....................... 365/189.12
6,147,926 * 11/2000 Park ..................................... 365/233
6,163,501 * 12/2000 Ohshima et al. .................... 365/233

* cited by examiner

*Primary Examiner*—Son Mai
(74) *Attorney, Agent, or Firm*—Herbert L. Lerner; Laurence A. Greenberg; Werner H. Stemer

(57) ABSTRACT

Data items D1, D2 read from memory cells MC are simultaneously buffer-stored in memory stages Si of a FIFO memory MEM and are read out again simultaneously from said FIFO memory at a later point in time. Output units OC1, OC2 serve for outputting, at a data output P, the first data D1 synchronously with positive edges of an external clock signal CLK and the second data D2 synchronously with negative edges of the external clock signal CLK.

3 Claims, 3 Drawing Sheets

FIG 2
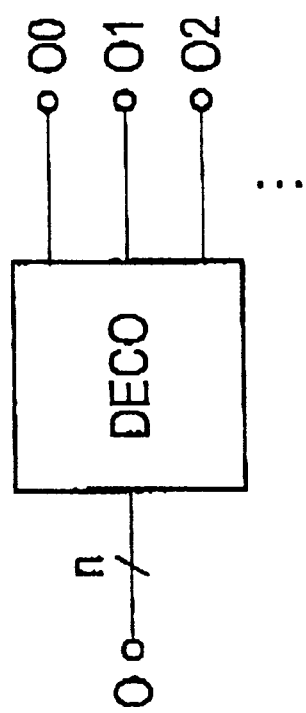
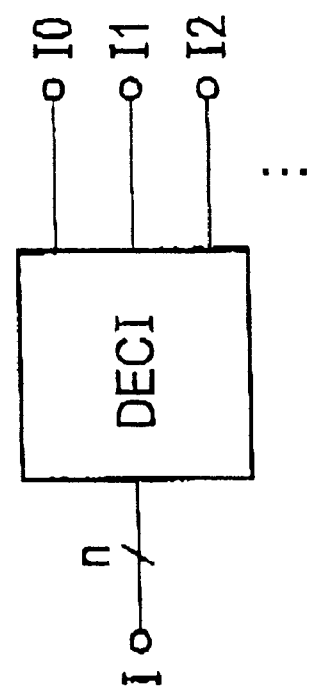

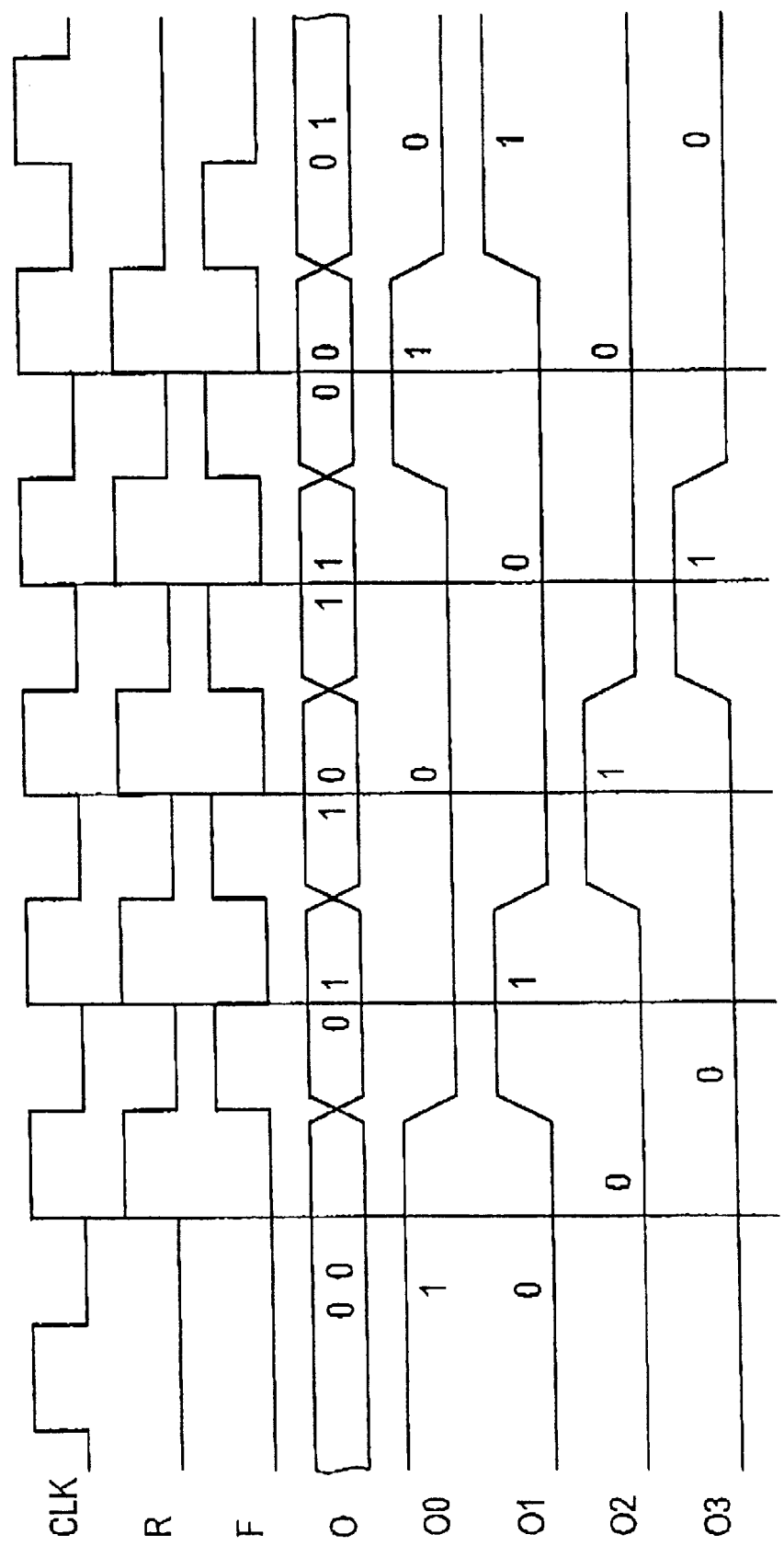

SYNCHRONOUS INTEGRATED MEMORY

BACKGROUND OF THE INVENTION

1. Field of the Invention

The invention lies in the field of integrated technology. More specifically, the invention relates to a synchronous integrated memory in which data to be read out are output at a data output synchronously with an external clock signal.

In some synchronous memories, for example in DDR (Double Data Rate) SDRAMs (Synchronous Dynamic Random Access Memories), two data bits are read simultaneously from the memory cells, which have to be output successively at the same data output, namely with a positive and a negative edge of an external clock signal fed to the memory. In memories of this type, it can happen that a number of pairs of simultaneously read data bits firstly have to be buffer-stored before they can be output successively at the data output.

2. Summary of the Invention

The object of the invention is to provide a synchronous integrated memory which overcomes the above-noted deficiencies and disadvantages of the prior art devices and methods of this kind, and in which the buffer storage of the simultaneously read data pairs and the sequential outputting of the individual data bits with the different edges of the external clock signal are achieved in a favorable manner.

With the above and other objects in view there is provided, in accordance with the invention, a synchronous integrated memory, comprising:

memory cells;
a FIFO memory connected to the memory cells, the FIFO memory having at least two memory stages each for simultaneously buffer-storing two data items read from the memory cells;
each of the memory stages having a first output for outputting a respective buffer-stored first data item and a second output for simultaneously outputting a respective buffer-stored second data item;
a first output unit having an input connected to the first output of each of the memory stages of the FIFO memory and a data output outputting the first data item respectively received from the memory stages in dependence on a first clock signal; and
a second output unit having an input connected to the second output of each of the memory stages of the FIFO memory, a register for buffer-storing the second data item respectively received from the FIFO memory, and a data output for subsequently outputting the second data item in dependence on a second clock signal.

In other words, a First-In-First-Out (FIFO) memory is provided for buffer-storing the data read from the memory cells. This is a memory from which the buffer-stored data are read out in the same order in which they were written in. In each memory stage of the FIFO memory, the two data items that are respectively read simultaneously are written in simultaneously and read out again simultaneously at a later point in time. The synchronization of the first datum with the first clock signal is effected by the first output unit. Synchronization of the outputting of the second datum with the second clock signal is effected by means of the second output unit. The two output units are thus used for outputting the first and second data from all the stages of the FIFO memory. Since the synchronization with the two clock signals is only effected by the output units, but the first and second data are in each case output simultaneously from the memory stage of the FIFO memory, the FIFO memory can be constructed very simply. This is because, owing to the simultaneous outputting of the first and second data, only one output control signal is necessary for each memory stage, which signal controls the outputting of both respectively buffer-stored data items.

In accordance with a concomitant feature of the invention, the first clock signal drives the first output unit such that the first output unit outputs the first data item at the data output synchronously with a first type of edge of an external clock signal; and the second clock signal drives the second output unit such that the second output unit outputs the second data item at the data output synchronously with a second type of edge of the external clock signal. In other words, the first and second clock signals are inverse of each other.

Other features which are considered as characteristic for the invention are set forth in the appended claims.

Although the invention is illustrated and described herein as embodied in an synchronous integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 are decoder circuit diagrams for generating control signals of a FIFO memory which are contained in FIG. 1; and FIG. 3 is a graph showing signal profiles of control signals in the circuit of FIG. 1.

DESCRIPTION OF THE PREFERRED EMBODIMENTS

Figure 1:
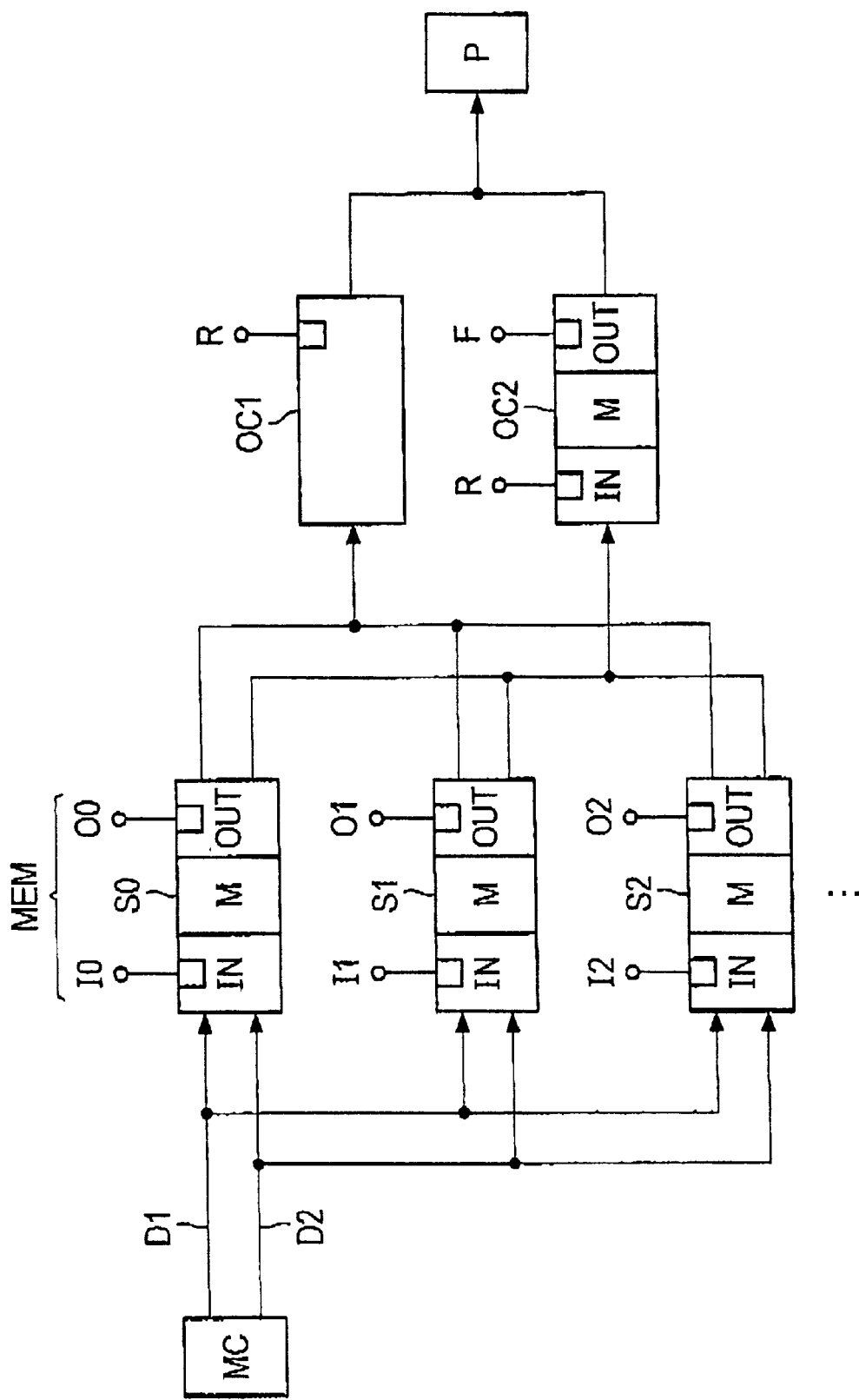
FIG. 1 is a diagrammatic view of the output data path of an exemplary embodiment of the synchronous memory.

Referring now to the figures of the drawing in detail and first, particularly, to FIG. 1 thereof, the synchronous integrated memory according to the invention, for example a DDR-SDRAM, has memory cells MC connected to a data output P via a FIFO memory MEM and two output units OC1, OC2. The FIFO memory MEM buffer-stores data D1, D2 to be read from the memory cells MC. The memory has a plurality of memory stages S0, S1, S2, only three of which have been illustrated in FIG. 1. Each memory stage Si has an input circuit IN, a memory area M, and an output circuit OUT. The input circuits In are driven by means of a respective input control signal I0, I1, I2 and the output circuits OUT are driven by means of a respective output control signal O0, O1, O2.

In the event of a read access, a number of pairs of data bits D1, D2 are successively read from the memory cells MC. The first datum D1 and the second datum D2 of each data pair are transferred simultaneously from the memory cells MC to the FIFO memory MEM, where they are stored in one of the memory stages Si. The memory stage in which buffer storage is effected is determined by means of the input control signals Ii. In the case of the FIFO memory MEM illustrated in FIG. 1, a data pair D1, D2 read first from the memory cells MC is buffer-stored in the first memory stage S0. The data pairs read subsequently are written to the respectively succeeding memory stages. The read-out from the FIFO memory MEM is effected, as usual in FIFO memories, in the same order in which the data were previously written to the FIFO memory. In this case, the two data items D1, D2 of each pair are output from the respective memory stage Si in each case simultaneously at a respective output of the output circuit Out, in a manner dependent on the associated output control signal Oi.

In FIG. 1, a first output of each output circuit OUT—the output serves for outputting the respective buffer-stored first datum D1—is connected to the data output P via the first output unit OC1, while a second output of each output circuit OUT—the output serves for outputting the respective buffer-stored second datum D2—is connected to the data output P via the second output unit. OC2. The first output unit OC1 outputs the first datum D1, fed from the FIFO memory MEM, at the data output P synchronously with a rising edge of an external clock signal. The second output unit OC2 outputs the second datum D2, respectively fed to it from the FIFO memory MEM, at the data output P synchronously with a negative clock edge of the external clock signal. For this purpose, the first output unit OC1 is controlled by a first clock signal R, which is identical to the external clock signal.

The second output unit OC2 has an input circuit IN clocked by the first clock signal R, a memory area M for buffer-storing the second datum D2 fed to it, and an output circuit OUT clocked by a second clock signal F. The second clock signal F is the inverse of the first clock signal R (see FIG. 3).

The two data items D1, D2 respectively communicated simultaneously from the FIFO memory MEM to the two output units OC1, OC2 arrive there simultaneously. The first datum D1 is output directly at the data output P by the first output unit OC1 with the positive edge of the first clock signal R. The second datum D2 is firstly buffer-stored in the memory area M of the second output unit OC2 with the positive edge of the first clock signal R via the input circuit IN of the second output unit. The second datum D2 is output at the data output P only with the positive edge of the second clock signal F. The memory area M of the second output unit OC2 and the above-described driving thereof by the first clock signal R and the second clock signal F make it possible, during the actual outputting of the second datum D2 from the memory area M of the second output unit OC2, for the next data pair D1, D2 to be transferred from one of the memory stages Si of the FIFO memory MEM to the output units OC1, OC2. Fast data outputting is ensured in this way.

FIG. 3 shows the profiles of some of the signals shown in FIG. 1. It has been assumed here that the FIFO memory MEM has four memory stages Si. The illustration shows the external clock signal CLK, the first clock signal R which is synchronous with the external clock signal CLK, and the second clock signal F. which is the inverse of the external clock signal CLK. Furthermore, the illustration shows the output control signals Oi of the four memory stages Si and also a coded output signal O, which will be discussed further below with regard to FIG. 2. The two data items D1, D2 supplied simultaneously from the memory cells MC have already been stored beforehand in ascending order in the memory stages Si of the FIFO memory MEM. With a respective positive level of the output control signal Oi, the buffer-stored data pair D1, D2 is forwarded from the respective memory stage Si via the associated output circuit Out to the output units OC1, OC2. FIG. 3 reveals that the first data D1 supplied by the respective memory stage Si are still being driven by the output circuit Out thereof when the positive edge of the external clock signal CLK occurs and outputting is consequently effected at the data output P. By contrast, the negative edge of the external clock signal CLK occurs after the next memory stage Si has already begun to output its data D1, D2. However, since the second datum D2 was buffer-stored with the positive edge of the first clock signal R in the second output unit OC2, this datum can subsequently be output at the data output P with the positive edge of the second clock signal F. Consequently, the data transfer between the FIFO memory MEM and the output units OC1, OC2, on the one hand, and the output units and the data output P, on the other hand, is effected simultaneously in each case.

FIG. 2 shows an input decoder DECI for decoding the input control signals Ii from FIG. 1 from an input signal I having a width of n bits which is fed to the input decoder DECI. FIG. 2 additionally shows a corresponding output decoder DECO, which, like the input decoder DECI, is part of the memory, to which the output signal O having a width of n bits is fed and which decodes therefrom the output control signals Oi for the memory stages Si of the FIFO memory MEM. There are four memory stages Si in the present case, so that n=2. The state of the output signal C for the different codings is entered in FIG. 3.

Since, in accordance with FIG. 1, the synchronization of the outputting of the two data items D1, D2 is only effected by the output units OC1, OC2, and not actually during the read-out of the buffer-stored data from the FIFO memory MEM, in the case of the invention it is advantageously possible, prior to the driving of the memory stages Si, to effect the above-described decoding both of the input control signals Ii and of the output control signals of without thereby influencing the timing of the data which are output at the data output P. In other words, the decoder circuits DECI, DECO are not situated in the time-critical path which is crucial for the synchronism of the data at the data output P. Therefore, it is also unimportant that the decoder circuits require different decoding times for different values of the input signal I and/or of the output signal O, as is generally the case with decoder circuits. A realization of the memory with the decoder circuits DECI, DECO illustrated in FIG. 2 is appropriate primarily when the generation of the control signals Ii, Oi for the FIFO memory MEM is locally separate from the latter, with the result that an excessively large area requirement would arise if the input control signals Ii and/or output control signals Oi had to be transferred uncoded from the corresponding generator circuit to the FIFO memory MEM. This would necessitate a much larger number of connecting lines than when the input signal I and/or the output signal O, which correspond to the control signals in coded form, are transferred from the corresponding generator circuit to the decoder circuits DECI, DECO which are preferably arranged directly at the FIFO memory.

As a result of the two output units OC1, OC2, which perform the synchronization of the data to be read out with the external clock signal CLK, a simple structure is produced for the memory stages Si. Each of them has to be fed in each case only one input control signal Ii and one output control signal Oi for buffer storage and for subsequent outputting of the data pairs D1, D2. The control signals Ii, Oi of the memory stages Si thus serve merely for the selection of the respective memory stage when the data are written to or read from the FIFO memory MEM. The synchronization with the external clock signal CLK is effected by the output units OC1, OC2, separately from the FIFO memory MEM.

We claim:

1. A synchronous integrated memory, comprising:

memory cells;

a FIFO memory connected to said memory cells, said FIFO memory having at least two memory stages each for simultaneously buffer-storing two data items read from said memory cells;

each of said memory stages having a first output for outputting a respective buffer-stored first data item and a second output for simultaneously outputting a respective buffer-stored second data item;

a first output unit having an input connected to said first output of each of said memory stages of said FIFO memory and a data output outputting the first data item respectively received from said memory stages in dependence on a first clock signal; and a second output unit having an input. connected to said second output of each of said memory stages of said FIFO memory, a register for buffer-storing the second data item respectively received from said FIFO memory, and a data output for subsequently outputting said second data item in dependence on a second clock signal.

2. The synchronous integrated memory according to claim 1, wherein said second clock signal is an inverse clock signal of said first clock signal.

3. The synchronous integrated memory according to claim 1, wherein the first clock signal drives said first output unit such that said first output unit outputs the first data item at said data output synchronously with a first type of edge of an external clock signal; and the second clock signal drives said second output unit such that said second output unit outputs the second data item at said data output synchronously with a second type of edge of the external clock signal.

* * * * *